US009403671B2

(12) United States Patent
Homeijer et al.

(10) Patent No.: US 9,403,671 B2
(45) Date of Patent: Aug. 2, 2016

(54) CALIBRATION OF MEMS SENSOR

(75) Inventors: Brian D. Homeijer, Corvallis, OR (US); Robert Newton Bicknell, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 190 days.

(21) Appl. No.: 14/116,092

(22) PCT Filed: Jun. 30, 2011

(86) PCT No.: PCT/US2011/042724
§ 371 (c)(1),
(2), (4) Date: Nov. 6, 2013

(87) PCT Pub. No.: WO2013/002809
PCT Pub. Date: Jan. 3, 2013

(65) Prior Publication Data
US 2014/0083164 A1    Mar. 27, 2014

(51) Int. Cl.
*G01C 25/00* (2006.01)
*G01P 21/00* (2006.01)
*G01V 13/00* (2006.01)
*B81B 3/00* (2006.01)
*G01V 1/16* (2006.01)
*G01H 11/00* (2006.01)
*B81C 99/00* (2010.01)

(52) U.S. Cl.
CPC .............. *B81B 3/0064* (2013.01); *B81C 99/003* (2013.01); *G01H 11/00* (2013.01); *G01V 1/162* (2013.01); *G01V 13/00* (2013.01); *B81B 2201/0235* (2013.01)

(58) Field of Classification Search
CPC ...... G01C 25/00; G01C 25/005; G01P 21/00; G01P 21/02
USPC ................. 73/1.37–1.38, 1.82, 1.75, 1.77
See application file for complete search history.

(56) References Cited

U.S. PATENT DOCUMENTS

| 5,103,667 | A | 4/1992 | Allen |
| 6,564,637 | B1 | 5/2003 | Schalk et al. |
| 6,619,123 | B2 | 9/2003 | Gianchandani et al. |
| 6,698,269 | B2 | 3/2004 | Baber et al. |
| 6,810,738 | B2 | 11/2004 | Sakakuchi |
| 6,883,638 | B1* | 4/2005 | Maxwell .............. G01D 11/245 181/102 |
| 7,093,478 | B2* | 8/2006 | Chau ....................... G01P 21/00 73/1.38 |
| 7,225,662 | B2 | 6/2007 | Kamata |

(Continued)

FOREIGN PATENT DOCUMENTS

| CN | 1320207 | 10/2001 |
| CN | 1470879 | 1/2004 |

(Continued)

OTHER PUBLICATIONS

Beeby et al; Micromachine Accelerometer with Microprocessor Controlled Self-Test Procedure; Sensor Review, vol. 21, No. 1, 2001, pp. 33-38 (6).

(Continued)

*Primary Examiner* — Peter Macchiarolo
*Assistant Examiner* — Anthony W Megna Fuentes
(74) *Attorney, Agent, or Firm* — Michael A. Dryja

(57) ABSTRACT

A micro electromechanical systems (MEMS) sensor is excited. The response of the MEMS sensor is measured. The MEMS sensor is calibrated.

11 Claims, 3 Drawing Sheets

(56) References Cited

U.S. PATENT DOCUMENTS

| | | |
|---|---|---|
| 7,340,956 B2 | 3/2008 | Deb et al. |
| 7,538,474 B2 | 5/2009 | Wong |
| 7,543,473 B2 | 6/2009 | Samuels |
| 7,578,189 B1 | 8/2009 | Mehregany |
| 8,210,023 B2 | 7/2012 | Jeanroy et al. |
| 8,381,570 B2 | 2/2013 | Ohms et al. |
| 2007/0209437 A1 | 9/2007 | Xue et al. |
| 2008/0049554 A1 | 2/2008 | Crice et al. |
| 2008/0233744 A1 | 9/2008 | Kaul et al. |
| 2009/0228235 A1* | 9/2009 | Carr .............. G01P 15/093 702/141 |
| 2009/0301176 A1 | 12/2009 | Rowe et al. |
| 2010/0199744 A1* | 8/2010 | Chan .............. G01P 21/00 73/1.38 |

FOREIGN PATENT DOCUMENTS

| | | |
|---|---|---|
| CN | 1811355 | 8/2006 |
| CN | 101568801 | 10/2009 |
| CN | 102095894 | 6/2011 |

OTHER PUBLICATIONS

L.A. Rocha et al.; A Pull-in Based Test Mechanism for Device Diagnostic and Process Characterization; Research Article; Hindawi Publishing Corp. Jan. 1, 2008.

Li Xu-hui, 'Status of Development and application of MEMS technology'. Transducer and Microsystem Technologies 5 (2006).

Li, Sheng-yi et al. 'Developments of Microaccelerometer Research.' Journal of National University of Defense Technology 6 (2004).

Rocha, Luis Alexandre et al. "A pull-in based test mechanism for device diagnostic and process characterization." VLSI Design 2008, No. 2 (2008): 16.

Zhang, Xia. 'MEMS system and Microaccelerometer.' Physics and Engineering 1(2004).

* cited by examiner

CALIBRATION OF MEMS SENSOR

Micro electromechanical systems (MEMS) devices are devices that integrate both electronic features and mechanical features on a micrometer scale or smaller. One type of MEMS device is a MEMS sensor. A MEMS sensor can measure an external stimulus. For example, a seismic MEMS sensor can detect vibrations in the environment in which the sensor has been deployed, which can be useful for fossil fuel exploration, earthquake detection, and other purposes.

DETAILED DESCRIPTION

As noted in the background section, a micro electromechanical systems (MEMS) sensor is a MEMS device integrating both electronic and mechanical features on a micrometer or smaller scale, to measure external stimuli. Typically after fabrication of such MEMS sensors, the MEMS sensors are statically calibrated prior to deployment within a desired field environment. Such calibration is static in the sense that the MEMS sensors are calibrated prior to deployment in a field environment. The MEMS sensors may be deployed as an array of a large number of such MEMS sensors, for instance.

However, once the MEMS sensors have been deployed in a particular field environment, they typically cannot be dynamically calibrated. Dynamic calibration means that the MEMS sensors can be calibrated in the field. The inability to dynamically calibrate MEMS sensors can be problematic. For instance, some sensors may degrade in accuracy over time, resulting in inaccurate measurements of the external stimuli that they are to measure. Other sensors may indeed even fail in the field.

Disclosed herein are techniques that permit a MEMS sensor to be dynamically calibrated even when deployed in a field environment in which the MEMS sensor is to measure an external stimulus. The MEMS sensor is excited, and a response of the MEMS sensor resulting from this excitation is measured. A parameter of the MEMS sensor is determined based on this measured response. The MEMS sensor is then calibrated based on this determined parameter. Such calibration can include concluding that the MEMS sensor is defective if the measured response and the determined parameter are far out of specification.

Figure 1:
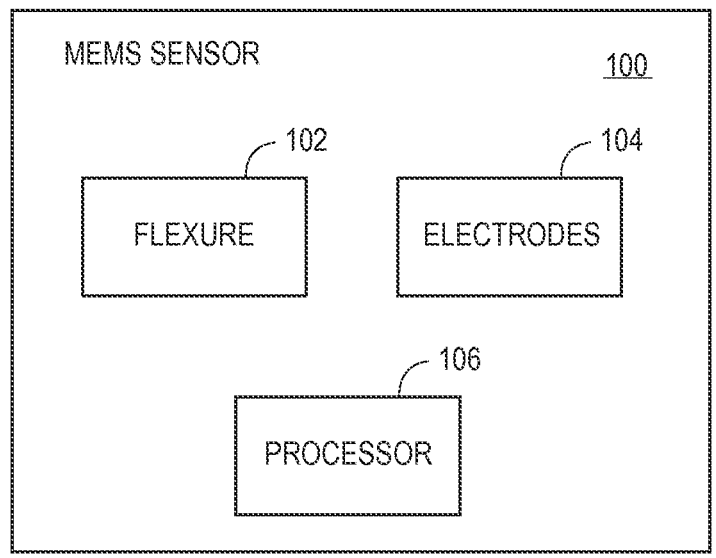
FIG. 1 is a block diagram of an example representative micro electromechanical systems (MEMS) sensor.

FIG. 1 shows a block diagram of an example representative MEMS sensor 100. The MEMS sensor 100 includes a flexure 102, electrodes 104, and a processor 106. The flexure 102 is physically displaced responsive to an external stimulus, such as vibration or movement of the MEMS sensor 100. The electrodes 104, which may include at least a pair of electrodes 104, measure or otherwise detect the physical displacement of the flexure 102. (That is, the electrodes 104 can be considered as detecting the physical displacement of the flexure 102 as a result of their measuring an electrical signal corresponding to this displacement.) The processor 106, which may be implemented as an electronic semiconductor integrated circuit (IC), receives the measurement from the electrodes 104, and can perform processing based thereon.

It is noted that in there can be more than two electrodes 104, such that some of the electrodes 104 are used to excite the MEMS sensor 100, and other of the electrodes 104 are used to measure the electrical response. For instance, there may be four electrodes 104: two to excite the MEMS sensor 100, and two to measure the electrical response. As another example, there may be three electrodes 104, where a common electrode 104 is used in both exciting the MEMS sensor 100 and measuring the electrical response.

Figure 2:
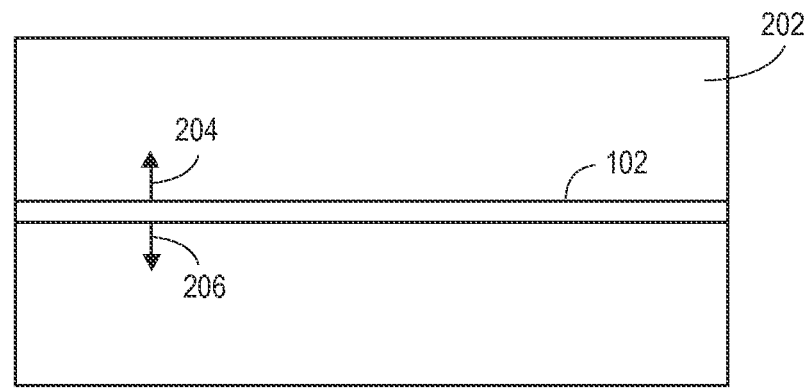
FIG. 2 is a cross-sectional side profile showing the flexure of an example representative MEMS sensor, in accordance with an example representative implementation of the MEMS sensor.

FIG. 2 shows a cross-sectional profile depicting the flexure 102 of the example representative MEMS sensor 100, in accordance with an example representative implementation of the MEMS sensor 100. The flexure 102 is disposed within a vacuum chamber 202. The flexure 102 is thus permitted to physically displace in the directions indicated by the arrows 204 and 206. For instance, when the MEMS sensor 100 is subjected to movement or vibration, the flexure 102 may physically displace within the vacuum chamber 202 as a result. This physical displacement is detected as a voltage, for instance, by the electrodes 104 of FIG. 1, and transmitted to the processor 106 of FIG. 1.

Figure 3:
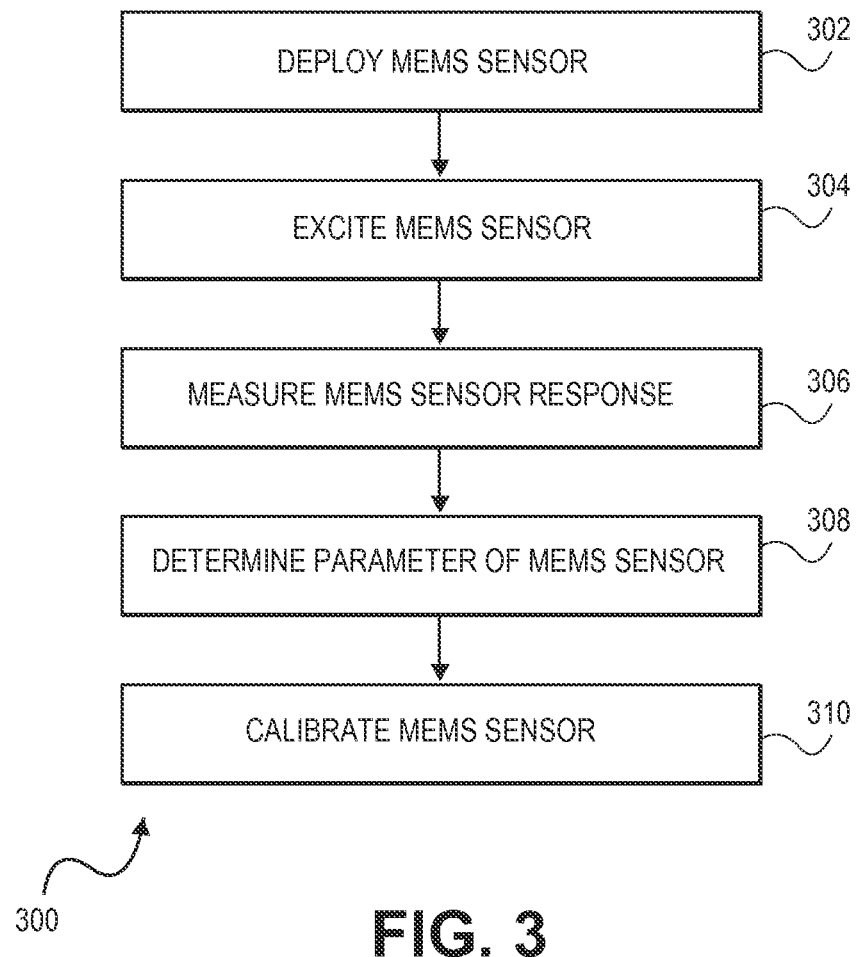
FIG. 3 is a flowchart of an example method for calibrating a MEMS sensor.

FIG. 3 shows an example method 300 for calibrating the MEMS sensor 100. The MEMS sensor 100 can be deployed within a field environment in which the MEMS sensor 100 is employed to measure external stimuli (302). As such, the remaining parts of the method 300 are performed while the MEMS 100 is within this field environment. A field environment is distinct from a lab or a testing environment, for instance.

The MEMS sensor 100 is excited (304). For instance, a known forced excitation of the flexure 102 may be applied. The excitation of the MEMS sensor 100 may be achieved by the processor 106 causing a known voltage to be applied to the electrodes 104, or a component or device external to the MEMS sensor 100 may apply such a known voltage to the electrodes 104. In both of these cases, the MEMS sensor 100 is excited electrically, although such electrical excitation results in mechanical, or physical, displacement of the flexure 102. It is further noted that in both of these cases, the same electrodes 104 that are used to measure or otherwise detect the physical displacement of the flexure 102 are also used to physically excite the flexure 102.

Once the MEMS sensor 100 has been excited, a response of the MEMS sensor 100 resulting from this excitation is measured or otherwise detected (306), such as via the electrodes 104. The response in question may be a physical response, an electrical response, and/or a different type of response of the MEMS sensor 100. In general, the response of the flexure 102 to the excitation is measured or otherwise detected.

One or more parameters of the MEMS sensor 100 are determined based on this measured response of the MEMS sensor 100 (308). The parameters can be determined by the processor 106 receiving the measured response from the electrodes 104. The parameters characterize the MEMS sensor 100. For instance, the MEMS sensor 100 may have certain nominal values for such parameters, which over time can drift. As described in detail below, the parameters can include the resonant frequency of the flexure 102, and the quality factor, or Q value, of the flexure 102. Other parameters can include the rate of change in voltage measured at the electrodes 104 per phase or carrier angle unit.

As such, the MEMS sensor 100 is calibrated based on the parameters that have been determined (310). The processor 106 can also calibrate the MEMS sensor 100 of which it is a part in one implementation. For instance, where the MEMS sensor 100 has parameters that have drifted from nominal values for these parameters, the processor 106 can use this information to adjust measurements taken by the electrodes 104 of the flexure 102, so that these measurements are more accurate.

Two particular example implementations of the method 300 are now described in more detail. The first example implementation has to do with calibrating a mechanical response of the MEMS sensor 100. The second example implementation has to do with calibrating an electrical response of the MEMS sensor 100. Other implementations are also possible, however, such as calibrating both the mechanical and the electrical responses of the MEMS sensor 100, for instance.

In the first example implementation, an electrical signal is applied to the electrodes 104 (304), which causes the flexure 102 to vibrate and then ring down. The electrical signal causes an electrical impulse, which is a voltage pulse of short duration, to be applied to the flexure 102. For example, a voltage of 10 volts applied for 100 microseconds may be applied. The application of this electrical signal causes the flexure 102 to vibrate. Because the impulse is of short duration, the vibration of the flexure 102 begins to decay almost immediately until the vibration ceases, which is referred to as ring down. This phenomenon is comparable to that of a bell that once struck, decreases in vibration and volume over time until it is silent again.

The electrodes 104 are used to measure the mechanical response of the flexure 102 resulting from this excitation (306). The mechanical response is particularly measured as a voltage corresponding to the vibration and subsequent ring down of the flexure 102 over time. That is, the voltage at the electrodes 104 at a particular point in time corresponds to the vibration of the flexure 102 at this point in time.

Figure 4:
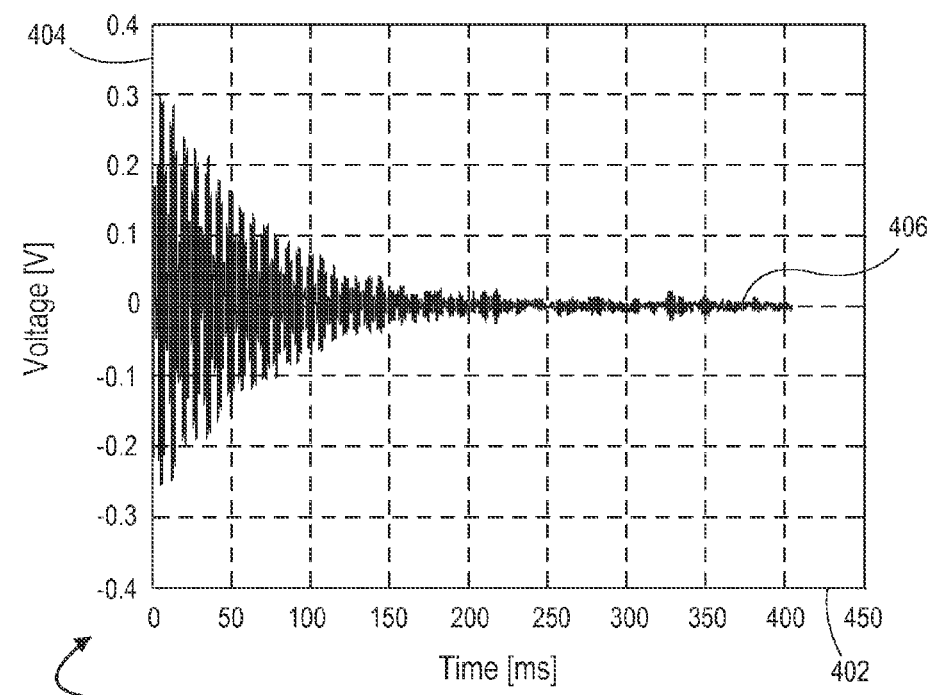
FIG. 4 is a diagram of an example representative mechanical response of a MEMS sensor upon application of an electrical impulse.

FIG. 4 shows a graph 400 of an example representative mechanical response 406 of the flexure 102 resulting from excitation thereof by an electrical impulse. The x-axis 402 denotes time, whereas the y-axis 404 denotes voltage. The mechanical response 406 approximates a damped sinusoidal function.

The processor 106 determines parameters of the MEMS sensor 100 based on this measured mechanical response of the flexure 102 as follows (308). The processor 106 fits a damped sinusoidal function to the voltage measured by the electrodes 104. The damped sinusoidal function is of the form $$V = V_0 + V_A e^{-\alpha t} \sin(\omega t + \theta).$$

By fitting this function to the voltage measured by the electrodes, values for $V_0, V_A, \alpha, \omega, \theta$ are obtained. $V_0$ specifies the DC voltage offset, and $V_A$ specifies the initial amplitude of the output voltage. The values $\alpha$ and $\omega$ are related to two particular parameters of the MEMS sensor 100: the resonant frequency f of the flexure 102, and the Q value of the flexure 102. A phase parameter $\theta$, can be used to determine an initial drive angle if desired.

The parameters are related to the values of the damped sinusoidal function fitted to the voltage measured by the electrodes 104 as follows:

$$Q = \frac{\pi}{2\alpha},$$

and $$f = \frac{\omega}{2\pi}.$$

The resonant frequency f is the frequency at which the flexure 102 resonates, whereas the Q value is the quality factor of the flexure 102. The quality factor is a dimensionless parameter that describes how damped the flexure 102 is. A higher Q value indicates that vibrations of the flexure 102 die out more slowly, for a longer period of ring down, whereas a lower Q value indicates that such vibrations die out more quickly, for a shorter period of ring down. After obtaining the values of the damped sinusoidal function fitted to the voltage measured by the electrodes, the processor 106 can thus determine the Q value and the resonant frequency f of the MEMS sensor 100.

The processor 106 calibrates the mechanical response of the MEMS sensor 100 based on the Q value and the resonant frequency f of the flexure 102 (310). For instance, the mechanical response of the MEMS sensor 100 can be considered as corresponding to the ratio of the physical displacement of the flexure 102 (i.e., of the MEMS sensor 100 more generally) to the acceleration of the MEMS sensor 100. Where a particular nominal voltage should be measured at the electrodes 104 for a given acceleration of the MEMS sensor 100, and since the electrical impulse applied to the electrodes 104 in part 304 is known a priori, the mechanical response of the MEMS sensor 100 can thus be calibrated based on the Q value and the resonant frequency of the flexure 102. As such, drift of the Q value and/or the resonant frequency over time, while the MEMS sensor 100 is in a field environment, can be compensated for by the processor 106 so that measurements provided by the MEMS sensor 100 remain accurate.

In the second example implementation, relating to calibrating an electrical response of the MEMS sensor 100, an electrical sweep is applied to the electrodes 104 (304). An electrical sweep is an alternating current (AC) voltage that has a varying phase, amplitude, or carrier angle, over time due to variance in the electrical current applied at any given particular moment in time. For example, a sinusoidal AC voltage at a frequency of 100 kilohertz (kHz), with a carrier voltage of 0.15 volts, may be applied. The flexure 102 vibrates in accordance with the frequency of the AC voltage that is applied.

The electrodes 104 are used to measure the electrical response of the flexure 102 resulting from this excitation (306). The electrical response is particularly measured as a change in the AC voltage corresponding to a change in the applied voltage. The voltage at the electrodes 104 at a particular point in time corresponds to the vibration of the flexure 102 at this point in time, as before.

It is noted that in this implementation, there are usually more than two electrodes, as noted above, such that some of the electrodes 104 are used to excite the MEMS sensor 100 in part 304, and other of the electrodes 104 are used to measure the electrical response in part 306. For instance, there may be four electrodes 104: two to excite the MEMS sensor 100, and two to measure the electrical response. As another example, there may be three electrodes 104, where a common electrode 104 is used in both exciting the MEMS sensor 100 and measuring the electrical response.

Figure 5:
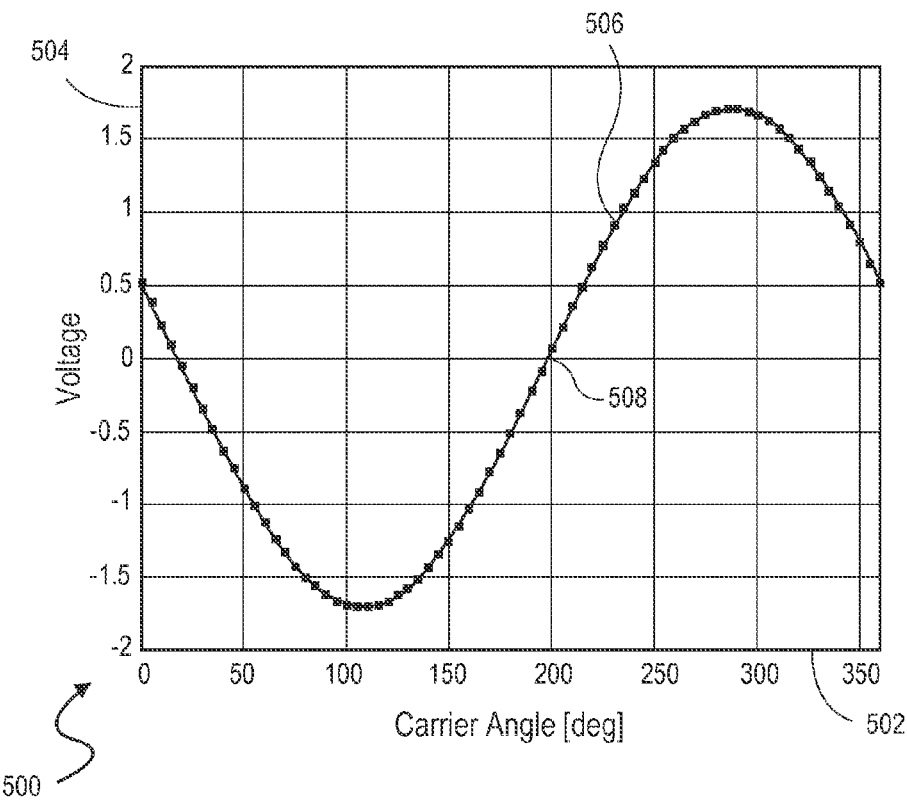
FIG. 5 is a diagram of an example representative electrical response of a MEMS sensor upon application of an electrical sweep.

FIG. 5 shows a graph 500 of an example representative electrical response 506 of the flexure 102 resulting from excitation thereof by an electrical sweep. The x-axis 502 denotes phase, or carrier angle, whereas the y-axis 504 denotes voltage. The electrical response 506 is a sine wave, in accordance with the sinusoidal nature of the electrical sweep.

The processor 106 determines parameters of the MEMS sensor 100 based on this measured electrical response of the flexure 102 (308). In particular, the processor 106 determines the rate of change in voltage measured at the electrodes 104 per phase or carrier angle unit, such as per angular degree. That is, the processor 106 determines the rate of change along the y-axis 504, per unit of the x-axis 502, which is the slope of the electrical response 506. This rate of change is desirably determined at a crossover point 508 from a negative voltage to a positive voltage within the electrical response, as at this crossover the rate of change is at least substantially linear.

The processor 106 calibrates the electrical response of the MEMS sensor 100 based on the rate of change in voltage per phase or carrier angle unit that has been determined (310). For instance, the electrical response of the MEMS sensor 100 can be considered as corresponding to the ratio of the voltage output by the MEMS sensor 100 (i.e., at the electrodes 104) to the physical displacement of the flexure 102 (i.e., of the MEMS sensor 100 more generally). Where a particular nominal voltage should be measured at the electrodes 104 for a given acceleration of the MEMS sensor 100, and since the electrical sweep applied to the electrodes 104 to excite the sensor 100 in part 304 of the method 300 is known a priori, the electrical response of the MEMS sensor 100 can thus be calibrated based on the rate of change in question that has been determined. As such, drift of this rate of change over time, while the MEMS sensor 100 is in a field environment, can be compensated for by the processor 106 so that measurements provided by the MEMS sensor 100 remain accurate.

As noted above, in one implementation, both the mechanical response and the electrical response can be calibrated in the example method 300. This implementation provides for calibration of the overall sensitivity of the MEMS sensor 100. The sensitivity of the MEMS sensor 100 can be expressed as a ratio of the voltage measured at the electrodes 104 to the acceleration of the MEMS sensor 100. The electrical response corresponds to the ratio of the voltage output by the MEMS sensor 100 to the physical displacement of the flexure 102, and the mechanical response corresponds to the ratio of the physical displacement of the flexure 102 to the acceleration of the MEMS sensor 100. As such, the electrical response multiplied by the mechanical response represents the overall sensitivity of the MEMS sensor 100.

More specifically, the overall sensitivity of the MEMS sensor 100 can be calibrated by calibrating the individual mechanical and electrical responses, as described above. It is noted in this respect that both the mechanical and electrical responses of the MEMS sensor 100 are detected or measured via the electrodes 104. As to the mechanical response, as described above, an electrical signal applied to the flexure 102 causes the flexure 102 to vibrate and then ring down. This mechanical response is measured as a voltage corresponding to the vibration and subsequent ring down of the flexure 102. By fitting a damped sinusoidal function to the measured voltage, the mechanical response is determined.

As to the electrical response, as described above, an electrical sweep applied to some electrodes 104 causes an electrical response in other electrodes 104, which is measured. The electrical response corresponds to a ratio of the voltage output by the MEMS sensor 100 to the physical displacement of the sensor 100. Because the mechanical response by comparison corresponds to a ratio of the physical displacement of the flexure 102 to the acceleration of the MEMS sensor 100, the electrical response and the mechanical response can be multiplied together to determine the overall sensitivity of the MEMS sensor 100, which is the ratio of the voltage at the electrodes 104 to the acceleration of the MEMS sensor 100.

In these respects, the terminology electrical response and mechanical response are somewhat misnomers, in that the electrical response does reflect an intrinsic mechanical response of the MEMS sensor 100, and vice-versa. However, the electrical response is considered electrical in that the actual physical properties of the flexure 102 are not of particular interest. Rather, some electrodes 104 are excited, and other electrodes 104 are measured. It is assumed (and known), therefore, that the electrical sweep applied to the electrodes 104 in question provides for an intrinsic mechanical response of the flexure 102, but this mechanical response is not of interest; rather, the voltage measured at the other electrodes 104 is the (electrical) response of interest.

Similarly, the mechanical response is considered mechanical in that the actual physical properties of the flexure 102 are of particular interest. However, this mechanical response is determined by measuring a voltage at the electrodes 104. The electrical response (i.e., the voltage measured at the electrodes 104) is not of particular interest here, other than for the fact that this voltage corresponds to the mechanical response of the flexure 102.

Calibration of the electrical response and/or the mechanical response of the MEMS sensor 100 can compensate for other factors that may exist in the field environment in which the MEMS sensor 100 has been deployed, in addition to or in lieu of parameter drift. Such other factors can include excessive noise in voltage measurement resulting from wind within the field environment and to which the MEMS sensor 100 is subjected, as well as excessive noise in voltage measurement resulting from human activity within the field environment and to which the MEMS sensor 100 is subjected. Other factors that can be compensated for include temperature changes within the field environment and that may affect the MEMS sensor 100, and atmospheric pressure changes within the field environment within the field environment and that may affect the MEMS sensor 100.

Figure 6:
FIG. 6 is a diagram of an example rudimentary array of MEMS sensors.

It is finally noted that the MEMS sensor 100 can be implemented as an array of such MEMS sensors 100 within a system. FIG. 6 shows such an example of a rudimentary such system 600. The system 600 includes an array of MEMS sensors 100A, 100B, . . . , 100N, which are collectively referred to as the array of MEMS sensors 100. The array of MEMS sensors 100 may be electrically connected to one another in a multiplexed or other manner. Alternatively, the MEMS sensors 100 may be electrically isolated from one another. There may be tens, hundreds, or more of the MEMS sensor 100 within the array. Advantages of having such a large number of MEMS sensors 100 include that measurements can be taken over the precise different physical areas in which the individual MEMS sensors 100 are disposed, and/or that an average measurement can be taken for the overall general physical area in which the array as a whole is disposed.

In the example of FIG. 6, each MEMS sensor 100 is able to be calibrated individually and separately from the other MEMS sensors 100. As such, individual variations among the MEMS sensors 100 can be accommodated. In some scenarios, the MEMS sensors 100 may be calibrated sequentially, such that at any given time, just one MEMS sensor 100 undergoes calibration. In other scenarios, the MEMS sensors 100 can be calibrated en masse over one or more groups of such sensors 100.

We claim:

1. A method comprising:
exciting a micro electromechanical systems (MEMS) sensor, via an electrical impulse, to cause a flexure of the MEMS sensor to vibrate and ring down;
measuring a mechanical response of the MEMS sensor resulting from excitation of the MEMS sensor, as a voltage corresponding to vibration and the ring down of the flexure over time;
determining a parameter of the MEMS sensor based on the response of the MEMS sensor that has been measured, by fitting a damped sinusoidal function corresponding to the vibration and the ring down over time to determine a resonant frequency and a Q value of the flexure; and,
calibrating the MEMS sensor based on the parameter of the MEMS sensor that has been determined.

2. The method of claim 1, further comprising deploying the MEMS sensor in a field environment in which the MEMS sensor is to be employed to measure an external stimulus, prior to exciting the MEMS sensor, such that the MEMS sensor is calibrated in the field environment in which the MEMS sensor is deployed.

3. The method of claim 1, wherein exciting the MEMS sensor comprises applying the electrical impulse to a plurality of electrodes of the MEMS sensor.

4. The method of claim 3, wherein the mechanical response is the vibration and the ring down of the flexure of the MEMS sensor, the voltage measured using the electrodes of the MEMS sensor.

5. The method of claim 4, wherein the parameter of the MEMS sensor is determined by a processor of the MEMS sensor.

6. The method of claim 5, wherein calibrating the MEMS sensor comprises calibrating the mechanical response of the MEMS sensor, by calibrating a ratio of a physical displacement of the flexure of the MEMS sensor to acceleration of the MEMS sensor, based on the resonant frequency and the Q value of the flexure, the mechanical response of the MEMS sensor calibrated by the processor of the MEMS sensor.

7. A micro electromechanical systems (MEMS) sensor comprising: a flexure configured to physically displace responsive to an external stimulus; a plurality of electrodes to which an electrical sweep is applied to provide the external stimulus, and configured to indirectly detect physical displacement of the flexure via a measurement of an electrical response resulting from the external stimulus, as an alternating current (AC) voltage resulting from vibration of the flexure; and a processor configured to determine a parameter of the MEMS sensor by determining a change in the AC voltage corresponding to the vibration of the flexure per phase of the AC voltage, and configured to calibrate the electrical response of the MEMS sensor by calibrating a ratio of a voltage output by the MEMS sensor to the physical displacement of the flexure based on the ratio of the change in the AC voltage to the phase of the AC voltage.

8. The MEMS sensor of claim 7, wherein the processor is to calibrate the MEMS sensor to at least partially compensate for one or more of:
excessive noise resulting from wind within a field environment in which the MEMS sensor is deployed;
excessive noise resulting from human activity within the field environment in which the MEMS sensor is deployed;
temperature changes within the field environment in which the MEMS sensor is deployed;
atmospheric pressure changes within the field environment in which the MEMS sensor is deployed.

9. A system comprising: an array of MEMS sensors, each MEMS sensor being individually calibratable in a field environment in which the array is deployed, each MEMS sensor comprising: a flexure configured to physically displace responsive to an external stimulus; a plurality of electrodes configured to detect physical displacement of the flexure, via a measurement of a mechanical response of the MEMS sensor and an electrical response of the MEMS sensor; and one or more processors configured to calibrate the MEMS sensors responsive to known forced excitations of the flexures, based on detections of the physical displacements of the flexures by the electrodes, by calibrating an overall sensitivity of each MEMS sensor expressed as a ratio of voltage to acceleration of the MEMS sensor, based on the mechanical response and the electrical response of the MEMS sensor.

10. The system of claim 9, wherein the processors are to calibrate the MEMS sensor to at least partially compensate for one or more of:
excessive noise resulting from wind within a field environment in which the MEMS sensor is deployed;
excessive noise resulting from human activity within the field environment in which the MEMS sensor is deployed;
temperature changes within the field environment in which the MEMS sensor is deployed;
atmospheric pressure changes within the field environment in which the MEMS sensor is deployed.

11. The method of claim 1, calibrating the MEMS sensor at least partially compensates for one or more of:
excessive noise resulting from wind within a field environment in which the MEMS sensor is deployed;
excessive noise resulting from human activity within the field environment in which the MEMS sensor is deployed;
temperature changes within the field environment in which the MEMS sensor is deployed;
atmospheric pressure changes within the field environment in which the MEMS sensor is deployed.

* * * * *